(12) United States Patent
Takahashi

(10) Patent No.: US 9,214,926 B2
(45) Date of Patent: Dec. 15, 2015

(54) THREE DIMENSIONAL INTEGRATED CIRCUIT AND METHOD FOR CONTROLLING THE SAME

(71) Applicant: NANYA TECHNOLOGY CORPORATION, Tao-Yuan Hsien (TW)

(72) Inventor: Tsugio Takahashi, Ibaraki (JP)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 60 days.

(21) Appl. No.: 14/222,677

(22) Filed: Mar. 23, 2014

(65) Prior Publication Data

US 2015/0270830 A1  Sep. 24, 2015

(51) Int. Cl.
 *H03K 3/289* (2006.01)
 *H03K 3/3562* (2006.01)
 *H01L 25/065* (2006.01)
 *H01L 23/48* (2006.01)

(52) U.S. Cl.
 CPC ............ *H03K 3/3562* (2013.01); *H01L 23/481* (2013.01); *H01L 25/0657* (2013.01)

(58) Field of Classification Search
 CPC .................................................. H03K 3/3562
 See application file for complete search history.

(56) References Cited

U.S. PATENT DOCUMENTS

2012/0138927 A1\* 6/2012 Kang ............................ 257/48

\* cited by examiner

*Primary Examiner* — Daniel Puentes
(74) *Attorney, Agent, or Firm* — CKC & Partners Co., Ltd.

(57) ABSTRACT

A three dimensional integrated circuit includes a master circuit, a slave circuit, and a through-silicon via (TSV). The master circuit is configured to receive and process an input data, a data strobe signal (DQS) and an input command to output a writing data signal to a master die. The through-silicon via (TSV) is electrically coupled between the master circuit and the slave circuit. The master circuit is configured to transfer the writing data signal to a slave die through the TSV. Furthermore, a method for controlling a three dimensional integrated circuit is disclosed herein.

8 Claims, 1 Drawing Sheet

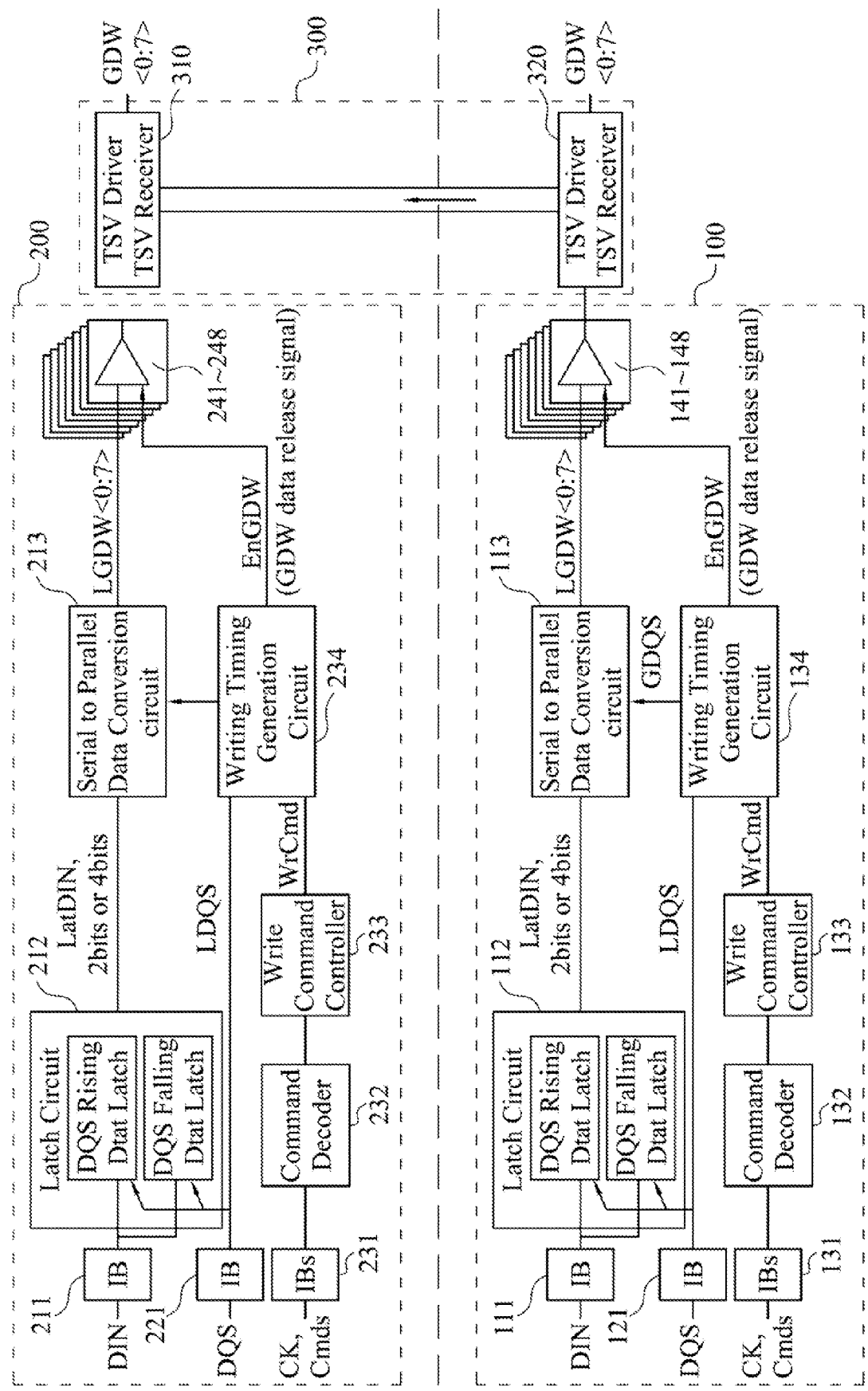

THREE DIMENSIONAL INTEGRATED CIRCUIT AND METHOD FOR CONTROLLING THE SAME

BACKGROUND

1. Field of Invention

The embodiment of the present invention relates generally to circuit and method for controlling the same and, more particularly, to a three dimensional integrated circuit and method for controlling the same.

2. Description of Related Art

In electronic engineering, a through-silicon via (TSV) is a vertical electrical connection passing completely through a silicon wafer or die. TSVs are a high performance technique used to create three dimensional packages and three dimensional integrated circuits, compared to alternatives such as package-on-package, because the density of the vias is substantially higher, and because the length of the connections is shorter.

The die size overhead by the inserting TSVs onto 3DS Master/Slave die will be approximately 2~3%. Because of the TSVs size cannot be shrunk, the total TSVs size in the die cannot be decreased. There has been much effort in trying to find a solution to the aforementioned problems. Nonetheless, there is still a need to improve the existing apparatuses and techniques in the art.

SUMMARY

A three dimensional integrated circuit and method for controlling the same are provided, which addresses the problem existing in the prior art.

One aspect of the embodiment of the present invention is to provide a three dimensional integrated circuit includes a master circuit, a slave circuit, and at least one through-silicon via (TSV). The master circuit is configured to receive and process an input data, a data strobe signal (DOS) and an input command to output a writing data signal to a master die. The TSV is electrically coupled between the master circuit and the slave circuit. The master circuit is configured to transfer the writing data signal to a shave die through the TSV.

In another aspect of the embodiment of the present invention, a method for controlling a three dimensional integrated circuit is provided. The three dimensional integrated circuit comprises a master circuit, a slave circuit, and at least one through-silicon via (TSV), and the TSV is electrically coupled between the master circuit and the slave circuit. The method comprises the steps of:

receiving and processing an input data, a data strobe signal (DOS) and an input command to output a writing data signal to a master die by the master circuit; and transferring the writing data signal to a slave die through the TSV by the master circuit.

As a result, the embodiments of the present invention provide a three dimensional integrated circuit and method for controlling the same, which address the problem of the total TSVs size in the die cannot be decreased.

BRIEF DESCRIPTION OF THE DRAWINGS

The invention can be more fully understood by reading the following detailed description of the embodiments, with reference made to the accompanying drawings as follows:

FIG. 1 schematically shows a circuit block diagram of a three dimensional integrated circuit according to embodiments of the present invention.

DETAILED DESCRIPTION

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a" "an," and "the" includes plural reference unless the context clearly dictates otherwise. Also, as used in the description herein and throughout the claims that follow, the meaning of "in" includes "in" and "on" unless the context clearly dictates otherwise.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. The use of examples anywhere in this specification, including examples of any terms discussed herein, is illustrative only, and in no way limits the scope and meaning of the invention or of any exemplified term. Likewise, the invention is not limited to various embodiments given in this specification.

As used herein, "around," "about" or "approximately" shall generally mean within 20 percent, preferably within 10 percent, and more preferably within 5 percent of a given value or range. Numerical quantities given herein are approximate, meaning that the term "around," "about" or "approximately" can be inferred if not expressly stated.

As used herein, the terms "comprising," "including," "having," "containing," "involving," and the like are to be understood to be open-ended, i.e., to mean including but not limited to.

FIG. 1 schematically shows a circuit block diagram of a three dimensional integrated circuit according to embodiments of the present invention. As shown in FIG. 1, the three dimensional integrated circuit includes a master circuit 100, a slave circuit 200, and a through-silicon via (TSV) 300. The master circuit 100 is configured to receive and process an input data DIN, a data strobe signal (DQS) and an input command Cmds to output a writing data signal to a master die. The TSV 300 is electrically coupled between the master circuit 100 and the slave circuit 200. The master circuit 100 is configured to transfer the writing data signal to a slave die through the TSV 300.

As a result, the three dimensional integrated circuit of the present invention needs just a small number of TSVs, but the same writing data related performances compared with a conventional three dimensional integrated circuit can be enabled by the three dimensional integrated circuit of the present invention.

In addition, due to the three dimensional integrated circuit of the present invention needing just a small number of TSVs, the three dimensional integrated circuit addresses the problem of the total TSV size in the die cannot be decreased. That is to say, the TSVs number in the three dimensional integrated circuit of the present invention can be minimized so that the total TSVs size in the die can be decreased. Specifically, compared with the die having TSVs on LatDin, the three dimensional integrated circuit of the present invention can reduce at least 16 TSVs.

When implementing the present invention, the TSV 300 comprises a TSV driver and TSV receiver 310, 320 for receiving the signals provided by the master circuit 100 or the slave circuit 200 and driving the master die and the slave die.

In one embodiment of the present invention, the writing data signal is not processed by the slave circuit. In other word, the writing data signal provided to the slave die is latched and converted form a serial data into a parallel data only in the master circuit 100. Furthermore, the DQS does not pass through the slave circuit, which means there is no DQS related signal is used in the slave die 200.

Reference is now made to FIG. 1, the master circuit 100 comprises input buffers 111, 121, 131, a latch circuit 112, a serial to parallel data conversion circuit 113, a command decoder 132, a writing command controller 133, a writing timing generation circuit 134, and data drivers 141-148.

With respect to the operation, the input buffers 111, 121, 131 are configured to receive the input signals. The latch circuit 112 is configured to receive the input data DIN and the DQS through the input buffer 111 and output a data signal LatDin based on the input data and the DOS.

For example, the input data DIN is latched by each rising/falling edges of DQS in the latch circuit 112. Specifically, the latch circuit 112 is composed of a static edge-triggered flip flop (FF), and the number of the FF is decided by the output bus number of latch circuit 112. For two bits bus output, LatDin <0:1>, two FFs are used in the latch circuit 112. For four bits bus output, four FFs are used in the latch circuit 112. For eight bits bus output, eight FFs are used in the latch circuit 112.

In addition, the serial to parallel data conversion circuit 113 is configured to convert the data signal from a serial data into a parallel data. The command decoder 132 is configured to decode the input command Cmds and output a command signal. The writing command controller 133 is configured to receive and process the command signal to output a write control signal WrCmd. The writing timing generation circuit 134 is configured to receive and process the write control signal and the DQS to output a data release signal EnGDW. The data drivers 141-148 are configured to receive and process the data signal and the data release signal EnGDW to output writing data signals to a master die.

In case of two bits or four bits data signal LatDin, the serial data are converted to the parallel data in the serial to parallel data conversion circuit 113. The signal GDQS is provided by the writing timing generation circuit 134, and the control and timing are decided by LDQS and the write control signal WrCmd. Specifically, the write control signal WrCmd is the external CK based signal and LDQS is the DOS based signal. The timing relation between the external CK and DOS is defined as tDOSS, and the writing timing generation circuit 134 is one of the detection circuits.

It is noted that, the elements which have the same element names in the master circuit 100 and the slave circuit 200 have the similar operations; therefore, the description regarding the operations of the elements in the slave circuit 200 is omitted herein for the sake of brevity.

In another aspect of the embodiment of the present invention, a method for controlling a three dimensional integrated circuit is provided. For understanding the foregoing method clearly, referring to FIG. 1 is needed. The three dimensional integrated circuit comprises the master circuit 100, the slave circuit 200, and the through-silicon via (TSV) 300, and the TSV 300 is electrically coupled between the master circuit 100 and the slave circuit 200. The method comprises the steps of:

to receiving and processing an input data, a data strobe signal (DQS) and an input command to output a writing data signal to a master die by the master circuit 100; and transferring the writing data signal to a slave die through the TSV by the master circuit 100.

As a result, the three dimensional integrated circuit controlled by the method of the present invention needs just a small number of TSVs, but the same writing data related performances compared with a conventional three dimensional integrated circuit can be enabled by the three dimensional integrated circuit of the present invention.

In addition, due to the three dimensional integrated circuit controlled by the method of the present invention needing just a small number of TSVs, the method addresses the problem of the total TSV size in the die cannot be decreased. That is to say, the TSVs number in the three dimensional integrated circuit the three dimensional integrated circuit controlled by the method of the present invention can be minimized so that the total TSVs size in the die can be decreased. Specifically, compared with the die having TSVs on LatDin, the three dimensional integrated circuit controlled by the method of the present invention can reduce at least 16 TSVs.

In one embodiment of the present invention, the step of transferring the writing data signal to the slave die through the TSV by the master circuit 100 comprises:

transferring the writing data signal to the slave die through the TSV 300 by the master circuit 100, wherein the writing data signal is not processed by the slave circuit 200.

In another embodiment of the present invention, the step of receiving and processing the input data, the DOS, and the input command to output the writing data signal to the master die by the master circuit 100 comprises:

receiving and processing the input data, the DOS, and the input command to output the writing data signal to the master die by the master circuit 100, wherein the DOS does not pass through the slave circuit 200.

In still embodiment of the present invention, the method for controlling the three dimensional integrated circuit further comprises the steps of:

receiving the input data and the DOS and outputting a data signal based on the input data and the DOS by the latch circuit 112;

converting the data signal from a serial data into a parallel data by the serial to parallel data conversion circuit 113;

decoding the input command and outputting a command signal by the command decoder 132;

receiving and processing the command signal to output a write control signal by the writing command controller 133;

receiving and processing the write control signal and the DOS to output a data release signal by the writing timing generation circuit 133; and receiving and processing the data signal and the data release signal to output a writing data signal to a master die by the data drivers 141-148.

Those having skill in the art will appreciate that the method for controlling a three dimensional integrated circuit can be performed with software, hardware, and/or firmware. For example, if an implementer determines that speed and accuracy are paramount, the implementer may opt for a mainly hardware and/or firmware implementation; alternatively, if flexibility is paramount, the implementer may opt for a mainly software implementation; or, yet again alternatively, the implementer may opt for some combination of hardware, software, and/or firmware. Those skilled in the art will recognize that optical aspects of implementations will typically employ optically oriented hardware, software, and or firmware.

In addition, those skilled in the art will appreciate that each of the steps of the method for controlling a three dimensional integrated circuit named after the function thereof is merely used to describe the technology in the embodiment of the present invention in detail but not limited to. Therefore, combining the steps of said method into one step, dividing the steps into several steps, or rearranging the order of the steps is within the scope of the embodiment in the present invention.

In view of the foregoing embodiments of the present invention, many advantages of the present invention are now apparent. The embodiment of the present invention provides a three dimensional integrated circuit and method for controlling the same, which address the problem of the total TSVs size in the die cannot be decreased.

It will be understood that the above description of embodiments is given by way of example only and that various modifications may be made by those with ordinary skill in the art. The above specification, examples and data provide a complete description of the structure and use of exemplary embodiments of the invention. Although various embodiments of the invention have been described above with a certain degree of particularity, or with reference to one or more individual embodiments, those with ordinary skill in the art could make numerous alterations to the disclosed embodiments without departing from the spirit or scope of this invention, and the scope thereof is determined by the claims that follow.

What is claimed is:

1. A three dimensional integrated circuit, comprising:
   a master circuit configured to receive and process an input data, a data strobe signal (DQS) and an input command to output a writing data signal to a master die, wherein the master circuit comprises:
      a latch circuit configured to receive the input data and the DQS and output a data signal based on the input data and the DQS;
      a serial to parallel data conversion circuit configured to convert the data signal from a serial data into a parallel data;
      a command decoder configured to decode the input command and output a command signal;
      a writing command controller configured to receive and process the command signal to output a write control signal;
      a writing timing generation circuit configured to receive and process the write control signal and the DQS to output a data release signal; and
      a data driver configured to receive and process the data signal and the data release signal to output the writing data signal to the master die;
   a slave circuit; and
   a through-silicon via (TSV) electrically coupled between the master circuit and the slave circuit;
   wherein the master circuit is configured to transfer the writing data signal to a slave die through the TSV.

2. The three dimensional integrated circuit according to claim 1, wherein the writing data signal is not processed by the slave circuit.

3. The three dimensional integrated circuit according to claim 1, wherein the DQS does not pass through the slave circuit.

4. The three dimensional integrated circuit according to claim 1, wherein the latch circuit comprises at least two flip flops.

5. The three dimensional integrated circuit according to claim 1, wherein the data signal is a two bits signal or a four bits signal, and the parallel data is an eight bits signal.

6. A method for controlling a three dimensional integrated circuit, wherein the three dimensional integrated circuit comprises a master circuit, a slave circuit, and a through-silicon via (TSV), and the through-silicon via (TSV) is electrically coupled between the master circuit and the slave circuit, wherein the method comprises:
   receiving and processing an input data, a data strobe signal (DQS) and an input command to output a writing data signal to a master die by the master circuit, wherein the step of receiving and processing the input data, the data strobe signal (DQS) and the input command to output the writing data signal to the master die by the master circuit comprises:
      receiving the input data and the DQS and outputting a data signal based on the input data and the DQS;
      converting the data signal from a serial data into a parallel data;
      decoding the input command and outputting a command signal;
      receiving and processing the command signal to output a write control signal;
      receiving and processing the write control signal and the DQS to output a data release signal; and
      receiving and processing the data signal and the data release signal to output the writing data signal to the master die; and
   transferring the writing data signal to a slave die through the TSV by the master circuit.

7. The method for controlling the three dimensional integrated circuit according to claim 6, wherein the step of transferring the writing data signal to the slave die through the TSV by the master circuit comprises:
   transferring the writing data signal to the slave die through the TSV by the master circuit, wherein the writing data signal is not processed by the slave circuit.

8. The method for controlling the three dimensional integrated circuit according to claim 6, wherein the step of receiving and processing the input data, the data strobe signal (DQS), and the input command to output the writing data signal to the master die by the master circuit comprises:
   receiving and processing the input data, the data strobe signal (DQS), and the input command to output the writing data signal to the master die by the master circuit, wherein the DQS does not pass through the slave circuit.

* * * * *